United States Patent
Denq et al.

(10) Patent No.: US 10,088,912 B2
(45) Date of Patent: Oct. 2, 2018

(54) COVERING FILM AND ELECTRONIC DEVICE

(71) Applicants: Bar-Long Denq, Taipei (TW); Chun-Ping Li, Taipei (TW); Chih-Wen Chiang, Taipei (TW); Chien-Chu Chen, Taipei (TW)

(72) Inventors: Bar-Long Denq, Taipei (TW); Chun-Ping Li, Taipei (TW); Chih-Wen Chiang, Taipei (TW); Chien-Chu Chen, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 252 days.

(21) Appl. No.: 14/979,576

(22) Filed: Dec. 28, 2015

(65) Prior Publication Data
US 2016/0209931 A1  Jul. 21, 2016

Related U.S. Application Data

(60) Provisional application No. 62/097,021, filed on Dec. 26, 2014.

(51) Int. Cl.
*G01D 11/28* (2006.01)
*G06F 3/02* (2006.01)
(Continued)

(52) U.S. Cl.
CPC .......... *G06F 3/0202* (2013.01); *B29C 43/006* (2013.01); *H04M 1/0202* (2013.01); *H05K 5/0217* (2013.01); *H04M 1/23* (2013.01)

(58) Field of Classification Search
CPC ... G06F 3/0202; H05K 5/0217; B29C 43/006; H04M 1/0202; H04M 1/23
(Continued)

(56) References Cited

U.S. PATENT DOCUMENTS

| 2011/0255835 A1* | 10/2011 | Yagi | G02B 6/0011 385/129 |
| 2014/0126176 A1* | 5/2014 | Yao | G02B 6/006 362/23.03 |

(Continued)

FOREIGN PATENT DOCUMENTS

| CN | 101539806 A | * | 9/2009 | ......... H03K 17/9629 |
| FR | 2907564 A1 | * | 4/2008 | ........... G06F 3/0202 |

(Continued)

OTHER PUBLICATIONS

English Translation of CN 101539806 A Sep. 2009 Lili.*
"Office Action of Taiwan Counterpart Application," dated Jun. 3, 2017, p. 1-p. 4.

*Primary Examiner* — Anh Mai
*Assistant Examiner* — Glenn Zimmerman
(74) *Attorney, Agent, or Firm* — JCIPRNET

(57) ABSTRACT

A covering film adapted to a keyboard module is provided. The covering film includes a semi-translucent layer. The semi-translucent layer has a plurality of first pressing regions and covers the keyboard module. The first pressing regions are aligned to a plurality of input regions of the keyboard module respectively, and each of the first pressing regions has a patterned indentation. In addition, an electronic device having the covering film is also provided.

18 Claims, 3 Drawing Sheets

(51) Int. Cl.
*B29C 43/00* (2006.01)
*H04M 1/02* (2006.01)
*H05K 5/02* (2006.01)
*H04M 1/23* (2006.01)

(58) Field of Classification Search
USPC ...................................... 362/23.03
See application file for complete search history.

(56) References Cited

U.S. PATENT DOCUMENTS

2014/0354305 A1* 12/2014 Hanssen ............ H03K 17/9622
   324/661
2016/0086746 A1* 3/2016 Chen .................... H01H 13/83
   362/23.03
2016/0132145 A1* 5/2016 Fourie .................... G06F 3/044
   345/174
2017/0301487 A1* 10/2017 Leong ................. H01H 13/704

FOREIGN PATENT DOCUMENTS

| TW | M364236 | 9/2009 | | |
|---|---|---|---|---|
| TW | M448778 | 3/2013 | | |
| TW | M471623 | 2/2014 | | |
| TW | I494962 | 8/2015 | | |
| TW | 201612936 A | * | 4/2016 | |
| WO | WO 0057266 A1 | * | 9/2000 | ........... G06F 3/0202 |

* cited by examiner

COVERING FILM AND ELECTRONIC DEVICE

CROSS-REFERENCE TO RELATED APPLICATION

This application claims the priority benefits of U.S. provisional application Ser. No. 62/097,021, filed on Dec. 26, 2014. The entirety of the above-mentioned patent application is hereby incorporated by reference herein and made a part of this specification.

BACKGROUND OF THE INVENTION

Field of the Invention

The invention relates to a covering film and an electronic device, and relates particularly to a covering film having patterned indentations and an electronic device having the covering film.

Description of Related Art

Benefiting from the advances in semiconductor devices and display technology, electronic devices are unceasingly trending toward increasingly smaller sizes, a plurality of functions and convenient portability. Common portable electronic devices include tablet PCs, smart phones and so forth.

The portable electronic device typically has a touch screen for a user to operate on, therefore a keyboard module has become a optional accessory for operation and not an essential accessory. For example, the user may insert the tablet PC to a docking station having a keyboard, or separate the tablet PC from the docking station and use independently. In addition, the user may perform inputs through the keyboard module on a protection cover of the tablet PC or smart phone, or perform inputs using only the touch screen of the tablet PC or smart phone. Accordingly, when the keyboard module corresponding to the portable electronic device is not used by the user and idle, the appearance of the keyboard tends to make the user feel the keyboard module is an excess, meaningless device. Furthermore, structures of the keys of the keyboard module make it not as even, therefore affecting the convenience when held or gripped by a user.

SUMMARY OF THE INVENTION

The invention provides a covering film, which makes an idle keyboard module have a non-keyboard like appearance and makes the structures of the keys of the keyboard module more even.

The invention provides an electronic device, wherein a covering film thereof makes an idle keyboard module have a non-keyboard like appearance and make the structures of the keys of the keyboard module more even.

A covering film of the invention is adapted to a keyboard module. The covering film includes a semi-translucent layer. The semi-translucent layer has a plurality of first pressing regions and covers the keyboard module. The first pressing regions are aligned to a plurality of input regions of the keyboard module respectively and each of the first pressing regions has a patterned indentation.

In an embodiment of the invention, a thickness of the aforementioned semi-translucent layer at each of the patterned indentations is lesser than a thickness of other parts of the semi-translucent layer.

In an embodiment of the invention, the aforementioned covering film further includes a translucent layer, wherein the translucent layer is superimposed on the semi-translucent layer, and the semi-translucent layer is located between the translucent layer and the keyboard module.

In an embodiment of the invention, the aforementioned translucent layer has at least one patterned protrusion.

In an embodiment of the invention, the aforementioned translucent layer has a plurality of second pressing regions, the second pressing regions are aligned to the input regions respectively, a number of the at least one patterned protrusion is a plurality, and the patterned protrusions are formed on the second pressing regions respectively.

In an embodiment of the invention, each of the aforementioned patterned protrusions surrounds the corresponding patterned indentation.

In an embodiment of the invention, the aforementioned translucent layer has an upper surface and a lower surface opposite to each other, the lower surface faces the keyboard module, and each of the patterned protrusions is formed on the upper surface.

In an embodiment of the invention, the aforementioned semi-translucent layer has an upper surface and a lower surface opposite to each other, the lower surface faces the keyboard module, and each of the patterned indentations is formed on the lower surface.

A covering film of the invention is adapted to a keyboard module. The covering film includes a semi-translucent layer and a translucent layer. The semi-translucent layer has at least one patterned indentation and covers the keyboard module. The translucent layer is superimposed on the semi-translucent layer, wherein the semi-translucent layer is located between the translucent layer and the keyboard module.

In an embodiment of the invention, a thickness of the aforementioned semi-translucent layer at the patterned indentation is lesser than a thickness of other parts of the semi-translucent layer.

In an embodiment of the invention, the aforementioned semi-translucent layer has a plurality of first pressing regions, the first pressing regions are aligned to a plurality of input regions of the keyboard module respectively, a number of the at least one patterned indentation is a plurality, and the patterned indentations are formed on the first pressing regions respectively.

In an embodiment of the invention, the aforementioned translucent layer has at least one patterned protrusion.

In an embodiment of the invention, the aforementioned patterned protrusion surrounds the patterned indentation.

In an embodiment of the invention, the aforementioned translucent layer has a plurality of second pressing regions, the second pressing regions are aligned to a plurality of input regions of the keyboard module respectively, a number of the at least one patterned protrusion is a plurality, and the patterned protrusions are formed on the second pressing regions respectively.

In an embodiment of the invention, the aforementioned translucent layer has an upper surface and a lower surface opposite to each other, the lower surface faces the keyboard module, and the patterned protrusion is formed on the upper surface.

In an embodiment of the invention, the aforementioned semi-translucent layer has an upper surface and a lower surface opposite to each other, the lower surface faces the keyboard module, and the patterned indentation is formed on the lower surface.

An electronic device of the invention includes a keyboard module and a covering film. The keyboard module is adapted to emit a light beam. The covering film includes a semi-translucent layer, wherein the semi-translucent layer covers the keyboard module, the light beam is adapted to pass through the semi-translucent layer and be transmitted to an outside of the covering film, such that at least one patterned bright region is formed on the covering film.

In an embodiment of the invention, the aforementioned semi-translucent layer has at least one patterned indentation, and the light beam forms the patterned bright region through the patterned indentation.

In an embodiment of the invention, the aforementioned semi-translucent layer has a plurality of first pressing regions, the first pressing regions are aligned to a plurality of input regions of the keyboard module respectively, a number of the at least one patterned indentation is a plurality, and the patterned indentations are formed on the first pressing regions respectively.

In an embodiment of the invention, a thickness of the aforementioned semi-translucent layer at the patterned indentations is lesser than a thickness of other parts of the semi-translucent layer.

In an embodiment of the invention, the aforementioned covering film further includes a translucent layer, the translucent layer is superimposed on the semi-translucent layer, and the semi-translucent layer is located between the translucent layer and the keyboard module.

In an embodiment of the invention, the aforementioned translucent layer has at least one patterned protrusion.

In an embodiment of the invention, the aforementioned translucent layer has a plurality of second pressing regions, the second pressing regions are aligned to a plurality of input regions of the keyboard module respectively, a number of the at least one patterned protrusion is a plurality, and the patterned protrusions are formed on the second pressing regions respectively.

In an embodiment of the invention, the aforementioned patterned protrusion surrounds the patterned indentation.

In an embodiment of the invention, the aforementioned translucent layer has an upper surface and a lower surface opposite to each other, the lower surface faces the keyboard module, and the patterned protrusion is formed on the upper surface.

In an embodiment of the invention, the aforementioned semi-translucent layer has an upper surface and a lower surface opposite to each other, the lower surface faces the keyboard module, and the patterned indentation is formed on the lower surface.

In an embodiment of the invention, the aforementioned keyboard module has at least one patterned light emitting region, and the light beam forms the patterned bright region through the at least one patterned light emitting region.

In an embodiment of the invention, the aforementioned keyboard module has at least one input region and a light shielding layer, the light shielding layer is disposed on the input region and partially exposes the input region to form the patterned light emitting region.

In an embodiment of the invention, the aforementioned input region is a key or a touch sensing layer.

In an embodiment of the invention, the aforementioned keyboard module includes a light guiding layer, and a light emitting surface of the light guiding layer has at least one patterned recess to form the patterned light emitting region.

In an embodiment of the invention, the aforementioned keyboard module includes a liquid crystal layer, the liquid crystal layer has a plurality of liquid crystal units, and each of the liquid crystal units is adapted to convert to a translucent state or an opaque state to form the patterned light emitting region.

In an embodiment of the invention, the aforementioned covering film has at least one patterned protrusion, and the patterned protrusion surrounds the patterned light emitting region.

In an embodiment of the invention, the aforementioned electronic device further includes a display module and a sensing unit, the sensing unit is disposed on one of the display module or the keyboard module, when the sensing unit senses the keyboard module and the display module are in a first operating state, the keyboard module emits the light beam, when the sensing unit senses the keyboard module and the display module are in a second operating state, the keyboard module stops emitting the light beam.

In an embodiment of the invention, when the aforementioned keyboard module and the display module are in the first operating state, the keyboard module is docked to the display module, and when the keyboard module and the display module are in the second operating state, the keyboard module is separated from the display module.

In an embodiment of the invention, when the aforementioned keyboard module and the display module are in the first operating state, an operation interface of the keyboard module faces upward, and when the keyboard module and the display module are in the second operating state, the operating interface of the keyboard module faces downward.

In an embodiment of the invention, the aforementioned electronic device further includes a display module, the display module has an input interface, the input interface is adapted to transmit an input signal to the keyboard module, such that the keyboard module emits the light beam or stops emitting the light beam.

In an embodiment of the invention, when the aforementioned keyboard module emits the light beam, an input function of the keyboard module is enabled, and when the keyboard module stops emitting the light beam, the input function of the keyboard module is disabled.

Based on the above, the invention uses a covering film which includes a semi-translucent layer to cover a keyboard module of an electronic device. When the keyboard module is idle and not emitting a light beam, the keyboard module will have a non-keyboard like appearance due to being covered by the covering film. In this way, the appearance of the keyboard may be prevented from making the user feel the keyboard is an excess, meaningless device. When the keyboard module is not idle and is operated on by the user, the light beam emitted by the keyboard module may produce a patterned bright region on a patterned indentation of the semi-translucent layer, such that the user can conveniently operate the keyboard module by an appearance of a text or symbol on the covering film corresponding to each of the keys. In addition, by covering the covering film on the keyboard module as aforementioned, the structures of the keys are more even, therefore increasing the convenience when held or gripped by the user. Furthermore, dust, dirt or damage to the keys may be prevented through the protection of the keyboard module by the covering film.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
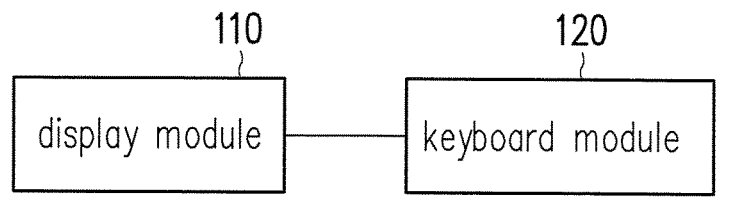
FIG. 1 is a schematic diagram illustrating partial components of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating partial components of an electronic device according to an embodiment of the invention. Referring to FIG. 1, an electronic device 100 of the present embodiment includes a display module 110 and a keyboard module 120. The display module 110, for example, is a tablet PC or a smart phone and the keyboard module 120, for example, is a docking station having a keyboard. A user may dock the display module 110 to the keyboard module 120 such that input may be performed by the keyboard module 120, or the display module 110 may be separated from the keyboard module 120 and used independently. In addition, the keyboard module 120 may also be a keyboard module on a protection cover of a tablet PC or a smart phone. The user may perform inputs through the keyboard module 120, or perform inputs using only a touch screen of the display module 110. In other embodiments, the display module 110 may be another type of electronic device (such as a display screen of a notebook computer), and the keyboard module 120 may be a corresponding keyboard apparatus, however the invention is not limited thereto.

Figure 2:
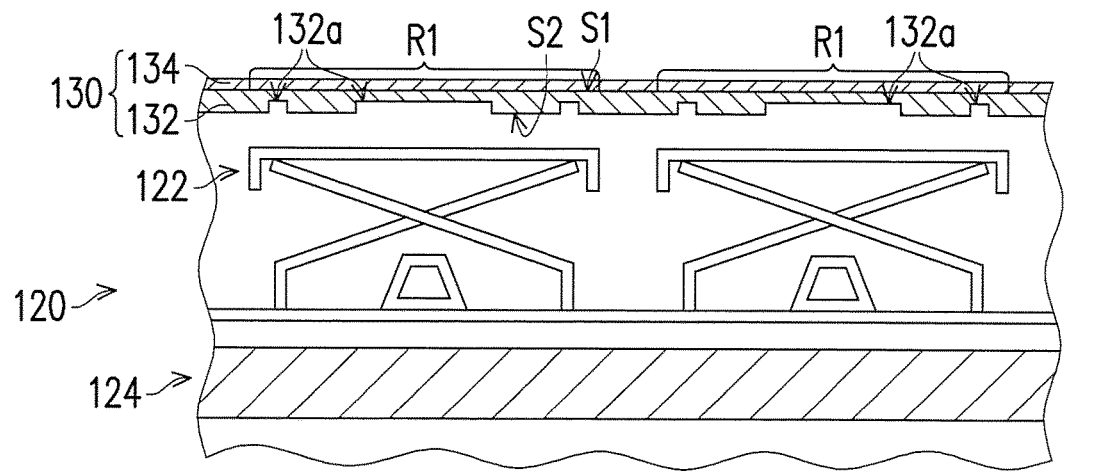
FIG. 2 illustrates a part of a structure of the electronic device of FIG. 1.

FIG. 2 illustrates a part of a structure of the electronic device of FIG. 1. Referring to FIG. 2, the keyboard module 120 of the present embodiment, for example, is a mechanical keyboard and has a plurality of input regions 122 (two are illustrated), wherein these input regions 122 are the plurality of keys of the keyboard module 120. The electronic device 100 further includes a covering film 130, wherein the covering film 130 includes a semi-translucent layer 132 and a translucent layer 134. The semi-translucent layer 132 covers the keyboard module 120, and the translucent layer 134 is superimposed on the semi-translucent layer 132 such that the semi-translucent layer 132 is located between the translucent layer 134 and the keyboard module 120. A transparency of the translucent layer 134 is greater than a transparency of the semi-translucent layer 132. The semi-translucent layer 132 has a plurality of first pressing regions R1 (two are illustrated) and a plurality of patterned indentations 132a (two sets are illustrated). These first pressing regions R1 are aligned to the input regions 122 of the keyboard module 120 respectively, and these patterned indentations 132a are formed at the first pressing regions R1 respectively.

Figures 3A, 3B:
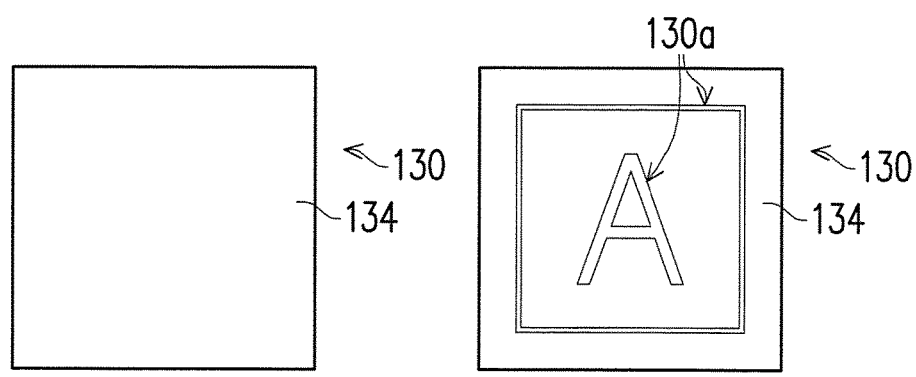
FIG. 3A is a partial top view of the electronic device of FIG. 2.
FIG. 3B illustrates a patterned bright region formed on a covering film of FIG. 3A.

FIG. 3A is a partial top view of the electronic device of FIG. 2. FIG. 3B illustrates a patterned bright region formed on a covering film of FIG. 3A. The keyboard module 120 shown in FIG. 2 is adapted to emit a light beam upwards by a backlight module 124. The light beam is adapted to pass through the semi-translucent layer 132 and the translucent layer 134 and be transmitted to the outside of the covering film 130. When the keyboard module 120 is not emitting the light beam, as shown in FIG. 3A, an external appearance of the covering film 130 does not produce a patterned bright region. When the keyboard module 120 is emitting the light beam, the light beam has a higher light penetration rate at each of the patterned indentations 132a due to a thickness of the semi-translucent layer 132 at each of the patterned indentations 132a is lesser than a thickness of the other parts of the semi-translucent layer 132, such that a patterned bright region 130a may be formed on the covering film 130 by each of the patterned indentations 132a, as shown in FIG. 3B.

By the aforementioned configuration, when the keyboard module 120 is idle and not emitting the light beam, the keyboard module 120 will have a non-keyboard like appearance due to being covered by the covering film 130. In this way, the appearance of the keyboard may be prevented from making the user feel the keyboard is an excess, meaningless device. When the keyboard module 120 is not idle and operated on by the user, the light beam emitted by the keyboard module 120 may produce the patterned bright region 130a on the patterned indentation 132a of the semi-translucent layer 132, such that the user can conveniently operate the keyboard module 120 with the appearance of a text or symbol on the covering film 130 corresponding to each of the keys (FIG. 3B illustrates the English letter A and a corresponding outer frame). In addition, by covering the covering film 130 on the keyboard module 120, the structures of the keys are more even, therefore the convenience when held or gripped by the user is increased. Furthermore, dust, dirt or damage to the keys may be prevented by the protection of the keyboard module 120 through the covering film 130.

Referring to FIG. 2, in the present embodiment, the semi-translucent layer 132 has an upper surface S1 and a lower surface S2 opposite to each other. The lower surface S2 faces the keyboard module 120. The patterned indentations 132a are formed at the lower surface S2 at an exterior surface further away from the covering film 130, such that the user is prevented from seeing the contour of the patterned indentation 132a when the keyboard module 120 is not emitting the light beam. More specifically, by stacking the translucent layer 134 on the semi-translucent layer 132 in the present embodiment, after an outside light beam enters the covering film 130 from the translucent layer 134, at least a part is reflected upward by an interface between the semi-translucent layer 132 and the translucent layer 134 to reduce a ratio of the outside light beam penetrating the semi-translucent layer 132. In addition, by stacking the translucent layer 134 on the semi-translucent layer 132 as aforementioned, the overall structural strength of the covering film 130 may be increased and the covering film 130 is prevented from being easily damaged at the patterned indentation 132a due to insufficient structural strength or from affecting the feel when pressed by the user.

In the present embodiment, a material of the semi-translucent layer 132, for example, is colored silicon and a material of the translucent layer 134, for example, is transparent silicon, such that the transparency of the translucent layer 134 is greater than the transparency of the semi-translucent layer 132. During the manufacturing process, for example, first a transparent silicon layer is provided as a base material of the translucent layer 134, and the transparent silicon layer is coated with a colored silicon layer as a base material of the semi-translucent layer 132. Next, the double layer silicon structure is hot pressed to cure the double layer silicon structure, and the patterned indentations 132a are formed on the semi-translucent layer 132 by laser engraving, etching or other suitable material removal manufacturing process. In another embodiment, the transparent silicon layer may first be provided as the base material of the translucent layer 134 and hot pressing the transparent silicon layer to cure the transparent silicon layer. Next, the colored silicon layer is coated on the cured transparent silicon layer to act as the base material of the semi-translucent layer 132. Then, the colored silicon layer is baked such that the colored silicon layer is cured. Then, the patterned indentations 132a are formed on the semi-translucent layer 132 by laser engraving, etching or other suitable material removal manufacturing process. In other embodiments, the covering film 130 may be formed by other suitable methods and materials and the invention is not limited hereto.

Figure 4:
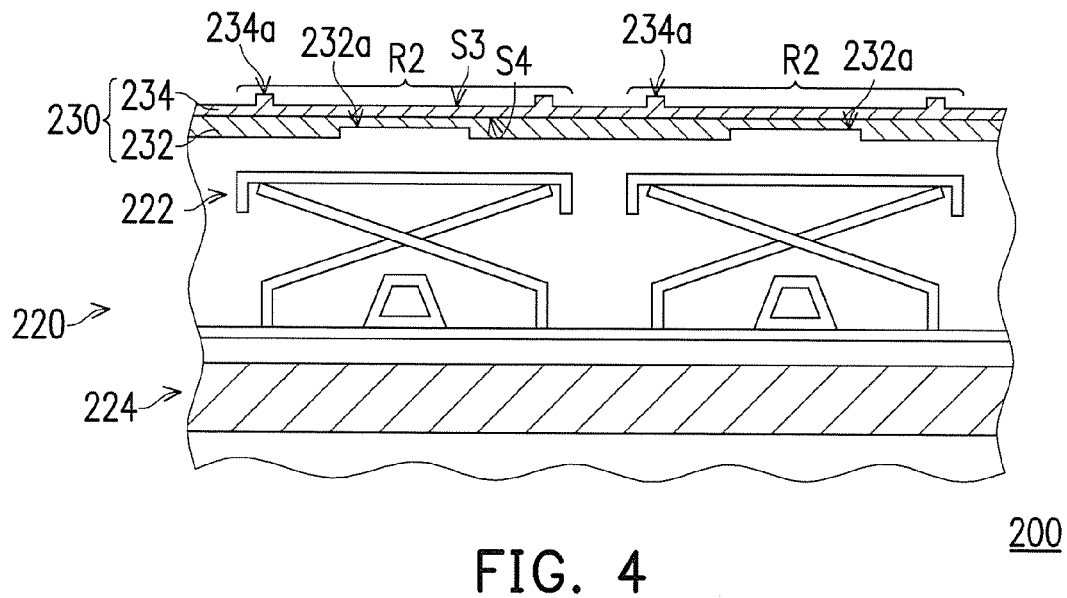
FIG. 4 illustrates a part of a structure of an electronic device according to another embodiment of the invention.

FIG. 4 illustrates a part of a structure of an electronic device according to another embodiment of the invention. In an electronic device 200 of FIG. 4, a configuration and operation of a keyboard module 220, input regions 222, a backlight module 224, a covering film 230, a semi-translucent layer 232, a translucent layer 234 is similar to the configuration and operation of the keyboard module 120, the input regions 122, the backlight module 124, the covering film 130, the semi-translucent layer 132, the translucent layer 134 of FIG. 2 and will not be repeated here. A difference between the electronic device 200 and the electronic device 100 lies in, the patterned indentation 232a of the semi-translucent layer 232 corresponds only to the text or symbol part of the key and does not correspond to the outer frame part of the key. A structure on the translucent layer 234 corresponds to the outer frame part of the key.

More specifically, the translucent layer 234 has a plurality of second pressing regions R2, a plurality of patterned protrusions 234a, and has an upper surface S3 and a lower surface S4 opposite to each other. The lower surface S4 faces the keyboard module 220. These second pressing regions R2 are aligned to the input regions 222 of the keyboard module 220 respectively, and these patterned protrusions 234a are formed on the upper surface S4 and aligned to the second pressing regions R2 respectively. In addition, each of the patterned protrusions 234a surrounds the corresponding patterned indentation 232a.

Figures 5A, 5B:
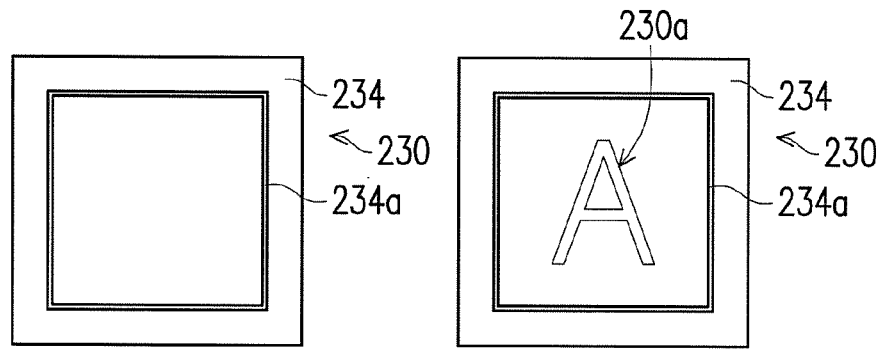
FIG. 5A is a partial top view of the electronic device of FIG. 4.
FIG. 5B illustrates a patterned bright region formed on a covering film of FIG. 5A.

FIG. 5A is a partial top view of the electronic device of FIG. 4. FIG. 5B illustrates a patterned bright region formed on a covering film of FIG. 5A. When the keyboard module 220 is not emitting the light beam, as shown in FIG. 5A, an external appearance of the covering film 230 does not produce a patterned bright region and the user may observe and touch the patterned protrusions 234a. When the keyboard module 220 is emitting the light beam, the light beam forms the patterned bright region 230a on the covering film 230 by each of the patterned indentations 232a, as shown in FIG. 5B. The text or symbol (illustrated as the English letter A) displayed by the patterned bright region 230a is surrounded by the outer frame which is made up by the patterned protrusions 234a.

Figure 6:
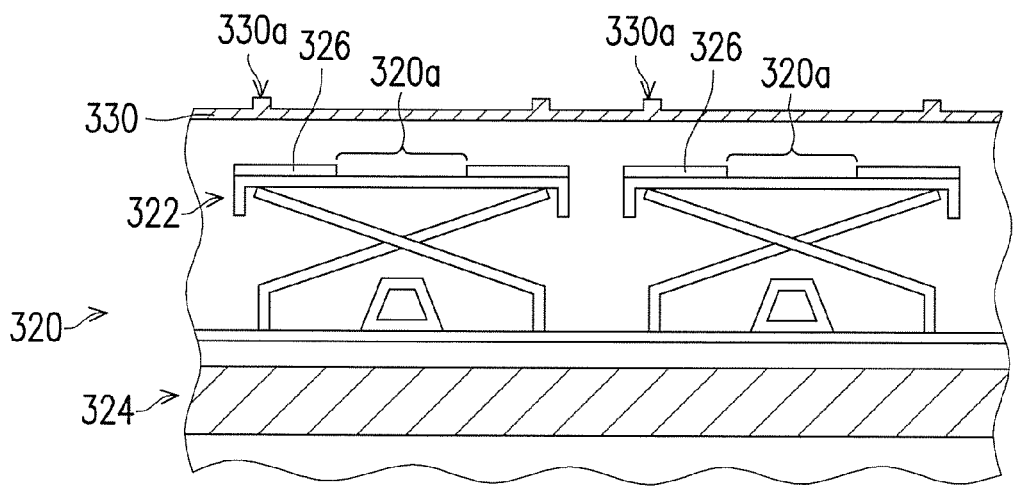
FIG. 6 illustrates a part of a structure of an electronic device according to another embodiment of the invention.

FIG. 6 illustrates a part of a structure of an electronic device according to another embodiment of the invention. In an electronic device 300 of FIG. 6, a configuration and operation of a keyboard module 320, input regions 322, a backlight module 324, a covering film 330, patterned protrusions 330a is similar to the configuration and operation of the keyboard module 220, the input regions 222, the backlight module 224, the covering film 230, the patterned protrusions 234a of FIG. 4 and will not be repeated here. A difference between the electronic device 300 and the electronic device 200 lies in, the electronic device 300 produces the patterned bright region through a patterned design on the keyboard module 320. Details are described below.

The keyboard module 320 has a plurality of patterned light emitting regions 320a (two are illustrated). The light beam emitted by the backlight module 324 may form a patterned bright region on the covering film 330 through the patterned light emitting regions 320a. More specifically, the keyboard module 320 has a plurality of light shielding layers 326. Each of the light shielding layers 326, for example, is a printed layer and configured on the corresponding input region 322 and partially exposing the input region 322 to form the patterned light emitting regions 320a. The input region 322, for example, is a key cap of the key. In the present embodiment, each of the light shielding layers 326 does not have printing material, for example, at a part of the input region 322 exposed by the light shielding layer 326, however it should not be construed as a limitation to the invention. Each of the light shielding layers 326 may also be a transparent printing material at the part of the input region 322 which is exposed by the light shielding layer 326. In addition, in other embodiments, the covering film 330 may also not have the patterned protrusions 330a on top thereof. In addition, the outer frame may be provided by the patterned light emitting regions 320a formed by the light shielding layers 326.

Figure 7:
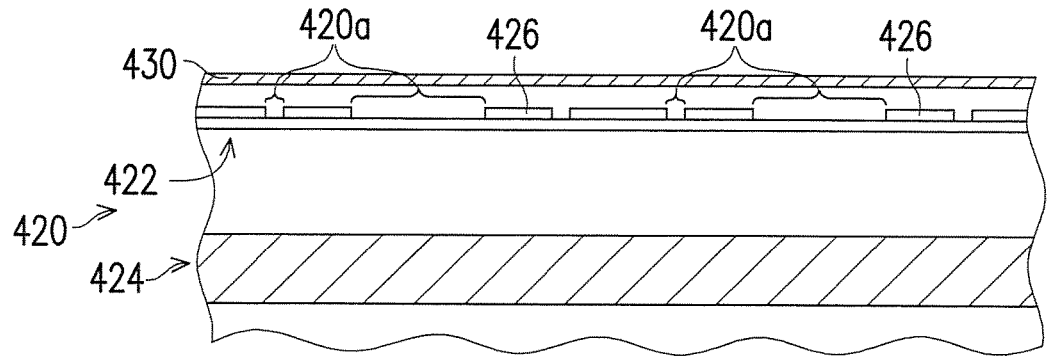
FIG. 7 illustrates a part of a structure of an electronic device according to another embodiment of the invention.

FIG. 7 illustrates a part of a structure of an electronic device according to another embodiment of the invention. In an electronic device 400 of FIG. 7, a configuration and operation of a keyboard module 420, patterned light emitting regions 420a, a backlight module 424, light shielding layers 426, a covering film 430 is similar to the configuration and operation of the keyboard module 320, patterned light emitting regions 320a, the backlight module 324, the light shielding layers 326, the covering film 330 of FIG. 6 and will not be repeated here. A difference between the electronic device 400 and the electronic device 300 lies in, the covering film 430 does not have a patterned protrusion on top thereof, and the electronic device 400 provides the outer frame through the patterned light emitting regions 420a formed by the light shielding layers 426. In addition, the input region 422 is a touch sensing layer and not a key cap of the key.

Figure 8:
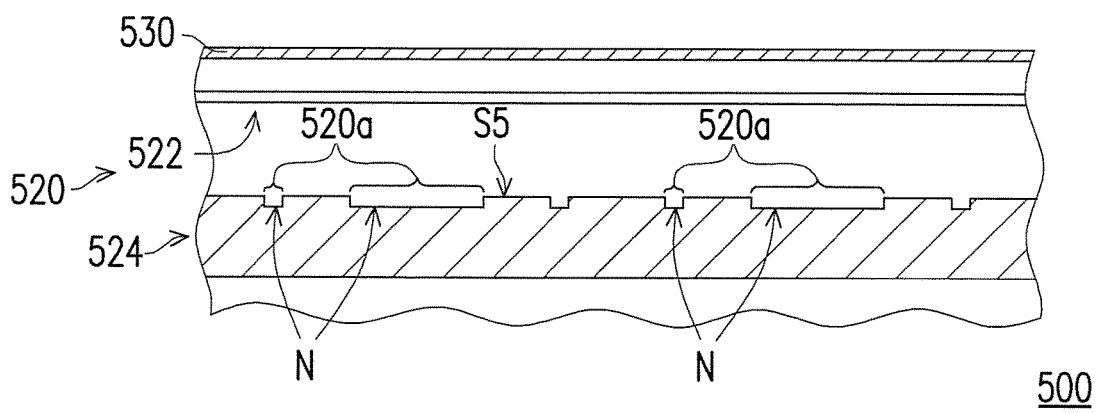
FIG. 8 illustrates a part of a structure of an electronic device according to another embodiment of the invention.

FIG. 8 illustrates a part of a structure of an electronic device according to another embodiment of the invention. In an electronic device 500 of FIG. 8, a configuration and operation of a keyboard module 520, a backlight module 524, a covering film 530 is similar to the configuration and operation of the keyboard module 420, the backlight module 424, the covering film 430 of FIG. 7 and will not be repeated here. A difference between the electronic device 500 and the electronic device 400 lies in, a light emitting surface S5 of a light guiding layer 524a of the backlight module 524 has a plurality of patterned recesses N to form patterned light emitting regions 520a. When a light beam emitted by the backlight module 524 is transmitted in the light guiding layer 524a, a travelling direction of the light beam changes to transmit upward at the intaglio N, such that the corresponding patterned light emitting region 520a is made by the pattern of the intaglio N.

Figure 9:
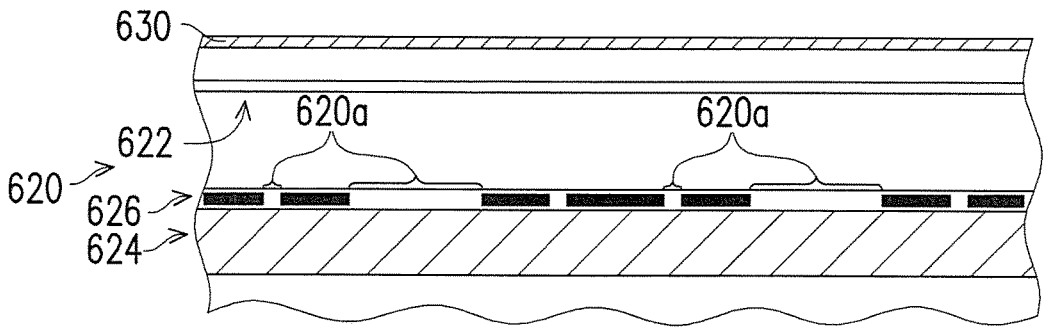
FIG. 9 illustrates a part of a structure of an electronic device according to another embodiment of the invention.

FIG. 9 illustrates a part of a structure of an electronic device according to another embodiment of the invention. In an electronic device 600 of FIG. 9, a configuration and operation of a keyboard module 620, an input regions 622, a backlight module 624, a covering film 630 is similar to the configuration and operation of the keyboard module 520, the input regions 522, the backlight module 524, the covering film 530 of FIG. 8 and will not be repeated here. A difference between the electronic device 600 and the electronic device 500 lies in, the keyboard module 620 includes a liquid crystal layer 626, wherein the liquid crystal layer 626 has a plurality of liquid crystal units, and each of the liquid crystal units is adapted to convert to a translucent state or an opaque state to form the patterned light emitting regions 620a. In this way, the text or symbol displayed by the patterned light emitting regions 620a may be changed by a state conversion of the liquid crystal unit at that location, to conform to various operational needs. For example, the text displayed by these input regions 622 may be changed to a different national language by the aforementioned method to increase the multi-usability of the keyboard module 620.

The electronic device 100 shown in FIG. 1 is used as an example below to describe a method for triggering a keyboard module. The electronic device 100 may further include a sensing unit, wherein the sensing unit may be a conductive type or an inductive type switch and is disposed at the display module 110 or the keyboard module 120. When the sensing unit senses the keyboard module 120 and the display module 110 are in a first operating state, the keyboard module 120 emits the light beam and an input function of the keyboard module 120 is enabled. When the sensing unit senses the keyboard module 120 and the display module 110 are in a second operating state, the keyboard module 120 stops emitting the light beam and the input function of the keyboard module 120 is disabled.

For example, if the display module 110 and the keyboard module 120 are a tablet PC and a corresponding dock station respectively, then the first operating state may be defined as the keyboard module 120 docked to the display module 110, and the second operating state may be defined as the keyboard module 120 separated from the display module 110. Namely, when the keyboard module 120 is docked to the display module 110, the keyboard module 120 emits the light beam and the input function of the keyboard module 120 is enabled. When the keyboard module 120 is separated from the display module 110, the keyboard module 120 stops emitting the light beam and the input function of the keyboard module 120 is disabled at the same time.

In addition, the sensing unit also may be a unit able to sense a facing direction of the sensing unit, for example, a mercury switch. Accordingly, if the display module 110 and the keyboard module 120 are the tablet PC and the corresponding keyboard module 120 on the protection cover respectively, then the first operating state may be defined as the operation interface of the keyboard module 120 facing upward and the second operating state may be defined as the operating interface of the keyboard module 120 facing downward, wherein the facing direction of the keyboard module 120 may be sensed by the mercury switch. Namely, when the user desires to operate on the keyboard module 120 and the operation interface thereof faces upward, the keyboard module 120 emits the light beam and the input function of the keyboard module 120 is enabled at the same time. When the user turns the protection cover to a back side of the display module 110 and the operation interface of the keyboard module 120 faces downward, the keyboard module 120 stops emitting the light beam and the input function of the keyboard module 120 is disabled at the same time.

In addition, the keyboard module 120 may also be triggered by the user operating on the display module 110. For example, the user may perform a touch input to the input interface (such as the touch screen) of the display module 110, and the input interface transmits a corresponding input signal to the keyboard module 120, such that the keyboard module 120 emits the light beam or stops emitting the light beam. The input signal may be generated by tapping the display module 110 to enable or closing the option of the keyboard module 120, or in the display module 110 setting the input signal to be linked-up with a particular application such that the input signal is generated by opening the application, however the invention is not limited hereto. In addition, the keyboard module 120 may further be set such that when the keyboard module 120 emits the light beam, then the input function of the keyboard module 120 is enabled, and when the keyboard module 120 stops emitting the light beam, then the input function of the keyboard module 120 is disabled. Namely, the light emitting function and the input function of the keyboard module 120 are set to be enabled or disabled synchronously, however the invention is not limited hereto.

In summary, the invention uses a covering film which includes a semi-translucent layer to cover a keyboard module of an electronic device. When the keyboard module is idle and not emitting a light beam, the keyboard module will have a non-keyboard like appearance due to being covered by the covering film. In this way, the appearance of the keyboard may be prevented from making the user feel the keyboard is an excess, meaningless device. When the keyboard module is not idle and is operated on by the user, the light beam emitted by the keyboard module may produce a patterned bright region on a patterned indentation of the semi-translucent layer, such that the user can conveniently operate the keyboard module by an appearance of a text or symbol on the covering film corresponding to each of the keys. In addition, by covering the covering film on the keyboard module as aforementioned, the structures of the keys are more even, therefore increasing the convenience when held or gripped by the user. Furthermore, dust, dirt or damage to the keys may be prevented through the protection of the keyboard module by the covering film.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising:
a keyboard module, adapted to emit a light beam; and
a covering film, comprising a semi-translucent layer, wherein the semi-translucent layer covers the keyboard module, and the light beam is adapted to pass through the semi-translucent layer and be transmitted to an outside of the covering film, such that at least one patterned bright region is formed on the covering film, wherein the keyboard module has at least one patterned light emitting region, and the light beam forms the patterned bright region through the at least one patterned light emitting region, and wherein the keyboard module comprises a liquid crystal layer, the liquid crystal layer has a plurality of liquid crystal units, and each of the liquid crystal units is adapted to convert to a translucent state or an opaque state to form the patterned light emitting region.

2. The electronic device as claimed in claim 1, wherein the keyboard module has at least one input region and a light shielding layer, the light shielding layer is disposed on the input region and partially exposes the input region to form the patterned light emitting region.

3. The electronic device as claimed in claim 1, wherein the keyboard module comprises a light guiding layer, and a light emitting surface of the light guiding layer has at least one patterned recess to form the patterned light emitting region.

4. The electronic device as claimed in claim 1, wherein the covering film has at least one patterned protrusion, and the patterned protrusion surrounds the patterned light emitting region.

5. The electronic device as claimed in claim 1, wherein the electronic device further comprises a display module and a sensing unit, the sensing unit is disposed on one of the display module or the keyboard module, when the sensing unit senses the keyboard module and the display module are in a first operating state, the keyboard module emits the light beam, when the sensing unit senses the keyboard module and the display module are in a second operating state, the keyboard module stops emitting the light beam.

6. The electronic device as claimed in claim 1, wherein the electronic device further comprises a display module, the display module has an input interface, and the input interface is adapted to transmit an input signal to the keyboard module, such that the keyboard module emits the light beam or stops emitting the light beam.

7. The electronic device as claimed in claim 1, wherein when the keyboard module emits the light beam, an input function of the keyboard module is enabled, and when the keyboard module stops emitting the light beam, the input function of the keyboard module is disabled.

8. The electronic device as claimed in claim 2, wherein the input region is a key or a touch sensing layer.

9. The electronic device as claimed in claim 5, wherein when the keyboard module and the display module are in the first operating state, the keyboard module is docked to the display module, and when the keyboard module and the display module are in the second operating state, the keyboard module is separated from the display module.

10. The electronic device as claimed in claim 5, wherein when the keyboard module and the display module are in the first operating state, an operation interface of the keyboard module faces upward, and when the keyboard module and the display module are in the second operating state, the operating interface of the keyboard module faces downward.

11. An electronic device, comprising:
a keyboard module, adapted to emit a light beam; and
a covering film, comprising a semi-translucent layer, wherein the semi-translucent layer covers the keyboard module, and the light beam is adapted to pass through the semi-translucent layer and be transmitted to an outside of the covering film, such that at least one patterned bright region is formed on the covering film,
wherein the electronic device further comprises a display module and a sensing unit, the sensing unit is disposed on one of the display module or the keyboard module, when the sensing unit senses the keyboard module and the display module are in a first operating state, the keyboard module emits the light beam, when the sensing unit senses the keyboard module and the display module are in a second operating state, the keyboard module stops emitting the light beam.

12. The electronic device as claimed in claim 11, wherein the semi-translucent layer has at least one patterned indentation, and the light beam forms the patterned bright region through the patterned indentation.

13. The electronic device as claimed in claim 11, wherein when the keyboard module and the display module are in the first operating state, the keyboard module is docked to the display module, and when the keyboard module and the display module are in the second operating state, the keyboard module is separated from the display module.

14. The electronic device as claimed in claim 11, wherein when the keyboard module and the display module are in the first operating state, an operation interface of the keyboard module faces upward, and when the keyboard module and the display module are in the second operating state, the operating interface of the keyboard module faces downward.

15. The electronic device as claimed in claim 11, wherein when the keyboard module emits the light beam, an input function of the keyboard module is enabled, and when the keyboard module stops emitting the light beam, the input function of the keyboard module is disabled.

16. An electronic device, comprising:
a keyboard module, adapted to emit a light beam; and
a covering film, comprising a semi-translucent layer, wherein the semi-translucent layer covers the keyboard module, and the light beam is adapted to pass through the semi-translucent layer and be transmitted to an outside of the covering film, such that at least one patterned bright region is formed on the covering film,
wherein the electronic device further comprises a display module, the display module has an input interface, and the input interface is adapted to transmit an input signal to the keyboard module, such that the keyboard module emits the light beam or stops emitting the light beam.

17. The electronic device as claimed in claim 16, wherein the semi-translucent layer has at least one patterned indentation, and the light beam forms the patterned bright region through the patterned indentation.

18. The electronic device as claimed in claim 16, wherein when the keyboard module emits the light beam, an input function of the keyboard module is enabled, and when the keyboard module stops emitting the light beam, the input function of the keyboard module is disabled.

* * * * *